United States Patent [19]
Oikawa

[11] Patent Number: 6,078,067
[45] Date of Patent: Jun. 20, 2000

[54] SEMICONDUCTOR DEVICE HAVING MUTUALLY DIFFERENT TWO GATE THRESHOLD VOLTAGES

[75] Inventor: Hirokazu Oikawa, Tokyo, Japan

[73] Assignee: NEC Corporation, Japan

[21] Appl. No.: 08/940,116

[22] Filed: Sep. 29, 1997

[30] Foreign Application Priority Data

Sep. 27, 1996 [JP] Japan .................................. 8-256424

[51] Int. Cl.[7] .................... H01L 31/072; H01L 31/109; H01L 31/0328; H01L 31/0336
[52] U.S. Cl. .................... 257/192; 257/194; 257/195; 438/571; 438/572
[58] Field of Search .................... 257/192, 194, 257/195; 438/571, 572

[56] References Cited

U.S. PATENT DOCUMENTS

| | | | |
|---|---|---|---|
| 4,615,102 | 10/1986 | Suzuki et al. | 29/571 |
| 4,733,283 | 3/1988 | Kuroda | 357/22 |
| 5,021,857 | 6/1991 | Suehiro | 357/42 |

FOREIGN PATENT DOCUMENTS

| | | | |
|---|---|---|---|
| 60-231368 | 11/1985 | Japan | H01L 29/80 |
| 2148740 | 6/1990 | Japan | H01L 21/338 |
| 402228435 | 11/1990 | Japan . | |
| 404245445 | 9/1992 | Japan . | |
| 8116034 | 5/1996 | Japan | H01L 27/095 |
| 8241983 | 9/1996 | Japan | H01L 29/778 |

*Primary Examiner*—William Mintel
*Attorney, Agent, or Firm*—Hayes, Soloway, Hennessey, Grossman & Hage, PC

[57] ABSTRACT

On a semiconductor substrate, a channel layer, an electron supply layer, a third semiconductor layer, a second etching stopper layer, a second semiconductor layer and a first etching stopper layer and a first semiconductor layer are grown in sequential order to form E-type and D-type FETs. The third semiconductor layer and the second semiconductor layer have equal layer thickness, and the second etching stopper layer and the first etching stopper layer have the equal layer thickness. Thus, Vth of the E-type and D-type FETs can be controlled at the predetermined value with high reproduction ability.

4 Claims, 11 Drawing Sheets

E-TYPE FET    D-TYPE FET

SEMICONDUCTOR DEVICE HAVING MUTUALLY DIFFERENT TWO GATE THRESHOLD VOLTAGES

BACKGROUND OF THE INVENTION

1. Field of the Invention

The present invention relates generally to a semiconductor device having mutually different two gate threshold voltages and a fabrication process thereof. More specifically, the invention relates to a compound semiconductor device including two kinds of field effect transistors (FET), an enhancement type transistor (hereinafter referred to as E-type FET or E-type FET region) and a depletion type transistor (hereinafter referred to as D-type FET or D-type FET region), and a fabrication process therefor.

2. Description of the Related Art

According to the trend for faster computer speeds in recent years, there is a strong demand for higher speed and lower power consumption of an integrated circuit device. Compound semiconductor devices, such as gallium arsenide (GaAs) semiconductor and the like, have greater electron mobility in comparison with silicon (Si) semiconductor devices. For this reason, application of the compound semiconductor devices for compact computers are greatly expected.

When an integrated circuit device is constructed with compound semiconductors, inverter circuits, and direct couple FET logic (DCFL) circuits, as basic elements are frequently used. In such a case, an E-type FET is used as a driving element and a D-type FET is used as a load element. A threshold voltage Vth of the E-type and D-type FETs is determined by a layer thickness of a carrier supply layer or a threshold voltage control layer.

As an effective method for simultaneously forming the E-type FET and the D-type FET on the same substrate, there has been known a selective etching method by providing an etching stop layer in an epitaxially grown crystal layer to control an etching stop position.

For example, as disclosed in Japanese Unexamined Patent Publication (Kokai) No. Showa 60-231368 and Japanese Unexamined Patent Publication No. Heisei 2-148740. Since the latter is an improvement of the for with reference to FIG. 1, taking the latter as an example.

A semiconductor device shown in FIG. 1 is fabricated by growing an undoped GaAs layer 203 to a thickness of 500 nm, an n-type AlGaAs layer 204 to a thickness of 30 nm, a fourth n-type GaAs layer 205a to a thickness of 10 nm serving as a threshold voltage control layer in a D-type FET, an n-type AlGaAs layer 206a to a thickness of 5 nm serving as a third etching stopper layer, a third n-type GaAs layer 205b to a thickness of 15 nm serving as a contact layer, an n-type AlGaAs layer 206b to a thickness of 5 nm serving as a second etching stopper layer, a second n-type GaAs layer 207 to a thickness of 60 nm serving as a contact layer, and an n-type AlGaAs layer 208 to a thickness of 5 nm serving as a first etching stopper layer and a first n-type GaAs layer 209 to a thickness of 40 nm serving as a contact layer on a semi-insulative GaAs substrate 201 in sequential order. A Schottky gate electrode of the E-type FET is in contact with the n-type AlGaAs layer 204 as the electron supply layer, and a Schottky gate electrode of the D-type FET is in contact with the n-type AlGaAs layer 206a serving as the third etching stopper layer.

A fabrication process of the compound semiconductor device shown in FIG. 1 is illustrated in FIGS. 2A to 2E in sequential order of process steps. At first, as shown in FIG. 2A, the undoped GaAs layer 203 serving as the channel layer, the n-type AlGaAs layer 204 serving as the electron supply layer, the fourth n-type GaAs layer 205a serving as the threshold voltage control layer in a D-type FET, the n-type AlGaAs layer 206a serving as the third etching stopper layer, the third n-type GaAs layer 205b serving as the contact layer, the n-type AlGaAs layer 206b serving as the second etching stopper layer, the second n-type GaAs layer 207 serving as a contact layer, the n-type AlGaAs layer 208 serving as the first etching stopper layer and the first n-type GaAs layer 209 serving as a contact layer on a semi-insulative GaAs substrate 201 are grown in sequential order by molecular beam epitaxy method (MBE method) or metal organic chemical vapor deposition (MOCVD) method. Subsequently, by way of mesa etching or ion implantation, isolation is performed. Etching is performed for the n-type GaAs layer 209 and the n-type AlGaAs layer 208 in the E-type FET region using a photo resist as a mask to form a recess 222.

Next, as shown in FIG. 2B, an insulation layer 210 with a thickness of 30 nm is grown over the entire surface. Then, using a photo resist as a mask, an opening is formed in the insulation layer 210. Then, using a lift off method, source electrodes 217 and 219 and drain electrodes 218 and 220 are formed as ohmic contacts.

Next, as shown in FIG. 2C, in order to form a gate electrode in each of the E-type and D-type FET regions, gate openings 213 and 214 are formed in the insulation layer 210 using a photo resist layer 211 as a mask using, e.g. by employing lithography and etching technologies. Isotropic etching is performed for respective n-type GaAs layers of respective E-type and D-type FET regions by way of RIE employing $CCl_2F_2$ gas. At this time, the n-type AlGaAs layers below the n-type GaAs layers 207 and 209 (i.e. the second etching stopper layer 206b and the first etching stopper layer 208) serve as etching stoppers.

Next, as shown in FIG. 2D, using a hydrofluoric acid type etching liquid, the n-type AlGaAs layers 206b and 208 as the etching stopper layers are selectively etched to expose the n-type GaAs layers 205b and 207, respectively, placed therebelow. Subsequently, isotropic selective etching of the n-type GaAs layers 205b and 207 is performed by RIE employing $CCl_2F_2$ gas for exposing the n-type AlGaAs layers 206a and 206b located therebelow. Then, similar to the process set forth above, the n-type AlGaAs layers 206a and 206b as etching stopper layers are selectively etched by hydrofluoric acid type etching liquid to expose the n-type GaAs layers 205a and 205b located therebelow. Also, under a condition of low pressure and high self-bias voltage, anisotropic selective etching for the n-type GaAs layers 205a and 205b is performed by RIE employing $CCl_2F_2$ gas to expose the n-type AlGaAs layer 204 and 206a.

Thereafter, as shown in FIG. 2E, Schottky junction type gate electrodes 215 and 216 are formed in respective gate openings 213 and 214 by aluminum or the like to complete the E-type and D-type FETs.

On the other hand, Japanese Unexamined Patent Publication No. Heisei 8-116034 discloses the prior art as illustrated in FIG. 3.

The semiconductor device of FIG. 3 has an undoped GaAs layer 302 with a thickness of 400 nm serving as a buffer layer, an undoped InGaAs layer with 303 with a thickness of 15 nm serving as a channel layer, an n-type AlGaAs layer 304 with a thickness of 30 nm serving as an electron supply layer, a second n-type GaAs layer 307 with a thickness of 4 nm serving as a threshold voltage control layer, an n-type AlGaAs layer 308 with a thickness of 3 nm serving as an etching stopper layer, and a first n-type GaAs layer 309 with a thickness of 100 nm serving as a contact layer are grown on a semi-insulative GaAs substrate 301 in sequential order. A Schottky gate electrode of the E-type FET is in contact with the n-type AlGaAs layer 304 as the electron supply layer and a Schottky gate electrode of the D-type FET is in contact with the n-type AlGaAs layer 308 as the etching stopper.

One example of the fabrication process of the semiconductor device shown in FIG. 3 will be discussed hereinafter with reference to FIGS. 4A to 4F.

At first, as shown in FIG. 4A, the undoped GaAs layer 302 as the buffer layer, the undoped InGaAs layer 303 as the channel layer, the n-type AlGaAs layer 304 as the electron supply layer, the second n-type GaAs layer 307 as the threshold voltage control layer, the n-type AlGaAs layer 308 as the etching stopper layer, and the first-n-type GaAs layer 309 as the contact layer grown on the semi-insulative GaAs substrate 301 are grown in sequential order. Then, isolation is performed by ion implantation.

Next, as shown in FIG. 4B, after growth of an insulation layer 310 of SiO$_2$ over the entire surface of the substrate, gate openings 313 and 314 are formed by lithography and RIE technology. After removal of a photo resist, selective dry etching is performed for the first n-type GaAs layer 309 relative to the n-type AlGaAs layer 308, using the insulation layer 310 as a mask.

Then, as shown in FIG. 4C, an insulation layer is grown on the surface. Thereafter, anisotropic etching is performed by RIE to form a side wall insulation layer 321.

Next, as shown in FIG. 4D, the gate opening portion 314 of the D-type FET region is covered with a photo resist layer 311b. After removing the n-type AlGaAs layer 308 exposed through the gate opening portion 313 of the E-type FET region, the n-type GaAs layer 307 is selectively removed by dry etching with respect to the n-type AlGaAs layer 304.

Then, as shown in FIG. 4E, the photo resist layer 311b is removed through a step subjecting overall wafer to plasma discharge using oxygen gas in a reaction vessel for generating plasma discharge, such as a barrel type or parallel plate reaction vessel (hereinafter referred to as "oxygen plasma") and a step for implementing water washing process after dipping in a high mixture liquid of dichlorobenzenphenol and alkyl benzene sulfonate at high temperature (120° C.), methyl ethyl ketone and alcohol in high sequential order (hereinafter referred to as "high temperature organic peeling").

Next, as shown in FIG. 4F, Schottky metal to be the gate electrode is deposited over the entire surface. Then, by lithography and RIE technology, gate electrodes 315 and 316 are formed. Subsequently, using a photo resist as a mask, an opening is formed in the insulation layer 310. Then, by a deposition lift method, source electrodes 317 and 319 and drain electrodes 318 and 320 are formed. Thus, the semiconductor device is obtained.

Next, a second example of the fabrication process of the semiconductor device of FIG. 3 will be discussed with reference to FIGS. 5A to 5C.

At first, as shown in FIG. 5A, after epitaxial growth, gate opening formation, side wall insulation layer formation are formed in similar manner to the first fabrication process, the gate opening 314 of the D-type FET region is covered with the photo resist layer 311b. The n-type AlGaAs layer 308 exposed through the gate opening 313 of the E-type FET region is removed by wet etching.

Next, as shown in FIG. 5B, after removing the photo resist layer 311b using methyl ethyl keton, selective dry etching is performed over the entire surface. Then, in the E-type FET region, the n-type GaAs layer 307 as the threshold voltage control layer is removed by selective etching with respect to the n-type AlGaAs layer 304 as the electron supply layer. On the other hand, in the D-type FET region, the n-type AlGaAs layer 308 serves as a mask to stop etching.

Next, as shown in FIG. 5C, similar to the first fabrication process, the gate electrodes 315 and 316, the source electrodes 317 and 318 and the drain electrodes 319 and 320 are formed to obtain the semiconductor device.

However, in the prior art illustrated in FIG. 1 and FIGS. 2A to 2E, when isotropic selective etching is performed simultaneously for the n-type GaAs layer 207 of the E-type FET and the n-type GaAs layer 209 of the D-type FET, the layer thickness of the n-type GaAs layer to be etched are significantly different. Therefore, over etching amount in the FET region having smaller layer thickness, i.e. D-type FET region in the shown example, becomes greater than that region having a larger layer thickness and the side etching amount also becomes greater. Therefore, in the D-type FET having a smaller thickness of the layer to be etched, the gate length becomes large, thus degrading controllability.

Furthermore, during the process step shown in FIG. 2D, namely in anisotropic selective dry etching implemented before formation of the gate electrode, since the layer thickness to be etched is significantly differentiated, the over etching amount in the FET region having smaller layer thickness, i.e. E-type FET region in the shown example, becomes greater. Thus, the etching amount of the n-type AlGaAs layer 204 as the electron supply layer in the E-type FET region becomes large to make Vth of the E-type FET smaller than the desired value, thus causing a degradation of controllability.

On the other hand, in the first fabrication process shown in FIGS. 4A to 4F of the semiconductor device shown in FIG. 3, oxygen plasma and high temperature organic peeling including chlorine are employed for removing the photo resist layer 311b hardened upon selective dry etching of the second n-type GaAs layer 307 in the E-type FET region. Therefore, AlGaAs layer is oxidized by oxygen plasma, and about 5 nm of AlGaAs layer is removed by high temperature organic solvent including chlorine. Accordingly, the AlGaAs layer of the E-type and D-type FETs is reduced. As a result, the desired Vth cannot be obtained, and controllability of Vth can be degraded.

On the other hand, in the second fabrication process illustrated in FIGS. 5A to 5C of the semiconductor device of FIG. 3, while the photo resist is not hardened and thus can be peeled off by methyl ethyl keton, the AlGaAs layer of the D-type FET region is subjected to plasma radiation upon selective dry etching of the overall surface, and the layer thickness is reduced which results in dry etching damage. Moreover, Vth becomes shallow in the D-type FET region. Thus, the difference between Vth of the D-type and E-type FET is not optional, or controllability of Vth of the D-type FET is degraded.

SUMMARY OF THE INVENTION

It is a first object of the present invention to make the Vth of D-type and E-type FETs to a desired value with high reproduction ability and to improve controllability of Vth.

A second object of the present invention is to improve controllability of a gate length, to improve the high frequency characteristics of an FET.

According to the first aspect of the invention, a semiconductor device having mutually different two gate threshold voltages, includes a channel layer, an electron supply layer, a third semiconductor layer, a second etching stopper layer, a second semiconductor layer, a first etching stopper layer, and a first semiconductor layer formed on a semiconductor substrate. A layer thickness of said second semiconductor layer is substantially equal to a layer thickness of said third semiconductor layer and a layer thickness of said first etching stopper layer is substantially equal to a layer thickness of said second etching stopper layer.

Here, a first gate electrode may be in contact with the upper surface of the electron supply layer, and a second gate electrode may be in contact with the upper surface of the third semiconductor layer. In this case, the first gate electrode may be isolated to prevent contact with the second etching stopper layer, the second semiconductor layer, the first etching stopper layer and the first semiconductor layer, and the second gate electrode may be isolated to prevent contact with said second semiconductor layer, said first etching stopper layer and said first semiconductor layer.

According to the second aspect of the present invention, a fabrication process of a semiconductor device comprises the steps of growing a channel layer, an electron supply layer, a third semiconductor layer, a second etching stopper layer, a second semiconductor layer having a layer thickness substantially equal to that of said third semiconductor layer, a first etching stopper layer having layer thickness substantially equal to that of said second etching stopper layer, and a first semiconductor layer in sequential order on a semiconductor substrate; selectively removing said first semiconductor layer in a region reserved for forming gate electrode in an enhancement type transistor region and a depletion type transistor; selectively removing said first etching stopper layer and said second semiconductor layer in said region where said gate electrode of said enhancement type transistor should be formed in sequential order; simultaneously and selectively removing said second etching stopper layer in said region where the gate electrode in said enhancement type transistor region should be formed and said first etching stopper layer where the gate electrode in said depletion type transistor should be formed; and simultaneously and selectively removing said third semiconductor layer in said region where the gate electrode in said enhancement type transistor region should be formed and said second semiconductor layer in said region where the gate electrode in said depletion type transistor should be formed.

According to the third aspect of the present invention, a fabrication process of a semiconductor device comprises the steps of growing a channel layer, an electron supply layer, a third semiconductor layer, a second etching stopped layer, a second semiconductor layer having a layer thickness substantially equal to that of said third semiconductor layer, a first etching stopper layer having a layer thickness substantially equal to that of said second etching stopper layer, and a first semiconductor layer in sequential order on a semiconductor substrate; selectively removing said first semiconductor layer in a region where gate electrodes in an enhancement type transistor region and a depletion type transistor should be formed, selectively removing said first etching stopper layer and said second semiconductor layer in said region where said gate electrode of said enhancement type transistor should be formed in sequential order, simultaneously and selectively removing said second etching stopper layer in said region where the gate electrode in said enhancement type transistor region should be formed and said first etching stopper layer in said region where the gate electrode in said depletion type transistor should be formed, depositing an insulation layer over the entire surface, and performing etching back to form a side wall insulative on the side surfaces of said second etching stopper layer, said second semiconductor layer, and said first etching stopper layer in said enhancement type transistor in a region reserved for forming the gate electrode of an enhanced type transistor, and to form a side wall on said first etching layer in the region reserved for formation of said gate electrode, and step of simultaneously and selectively removing said third semiconductor layer in said region reserved for forming the gate electrode in said enhancement type transistor region and said second semiconductor layer in said depletion type transistor.

In the foregoing fabrication processes, the first semiconductor layers in a region reserved for forming the gate electrode in an enhancement type transistor region and a depletion type transistor may be selectively removed by anisotropic etching, said second semiconductor layer in said region reserved for forming said gate electrode of said enhancement type transistor in sequential order may be selectively removed by anisotropic etching, said third semiconductor layer in said region reserved for forming the gate electrode in said enhancement type transistor region and said second semiconductor layer in said depletion type transistor may be selectively removed by isotropic etching. In the alternative, upon selectively removing all of said semiconductor layers and said etching stopper layers, isotropic etching may be used.

In the foregoing semiconductor device or the fabrication process of the semiconductor device, the expression that the layer thickness of the third semiconductor layer and the second semiconductor layer and the layer thickness of the second etching stopper layer and the first etching stopper layer are substantially equal, represents that they are within a predetermined range where the effect of the present invention can be obtained. In practice, the layer thickness of said second semiconductor layer is less than or equal to 120% and greater than or equal to 80% of the layer thickness of said third semiconductor layer, and the layer thickness of said first etching stopper layer is less than or equal to 120% and greater than or equal to 80% of the layer thickness of said second etching stopper layer. That is, in the case of the etching stopper layer, when the layer thickness difference is out of the foregoing range, the thicker etching stopper layer cannot be removed completely by oxygen plasma and organic solvent containing chlorine, as such would interfere with the next etching of GaAs layer, thereby making it impossible to obtain the desired Vth. On the other hand, in case of the semiconductor layer (GaAs layer), when the layer thickness difference is out of the foregoing range, over-etching of the GaAs layer would become excessive thus making the AlGaAs layer excessively thin, making it impossible to obtain the desired Vth.

As set forth above, according to the present invention, the second and third semiconductor layers can be etched simultaneously with a minimum time, and the gate electrode can be formed immediately thereafter. Therefore, the desired value of Vth of the E-type and D-type FETs can be obtained with high reproduction ability, and its controllability can be improved. Furthermore, control of the gate length which is the most important factor for high frequency characteristics of FET can be improved.

BRIEF DESCRIPTION OF THE DRAWINGS

The present invention will be understood more fully from the detailed description given herebelow and from the accompanying drawings of the preferred embodiment of the present invention, which, however, should not be taken to be limitative to the invention, but are for explanation and understanding only.

In the drawings.

DESCRIPTION OF THE PREFERRED EMBODIMENT

The present invention will be discussed hereinafter in detail in terms of the preferred embodiment of the present invention with reference to the accompanying drawings. In the following description, numerous specific details are set forth in order to provide a thorough understanding of the present invention. It will be obvious, however, to those skilled in the art that the present invention may be practiced without these specific details. Well-known structures are not shown in detail in order to more clearly set forth the salient features of the present invention.

Figure 1:
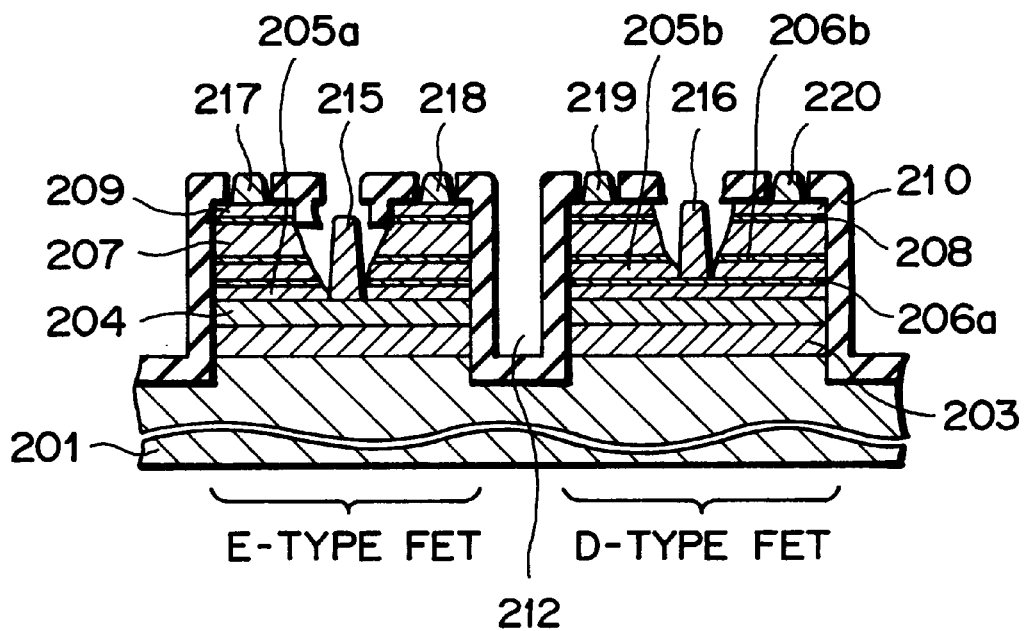
FIG. 1 is a section showing the prior art of the semiconductor device.
Figure 2A:
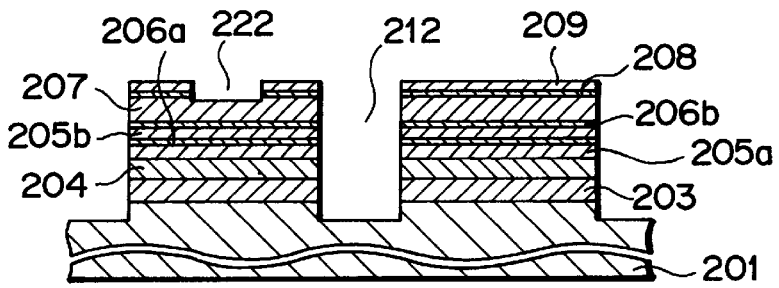
FIGS. 2A to 2E are sections showing a fabrication process of the semiconductor device shown in FIG. 1, illustrating process steps in sequential order.
Figure 2B:
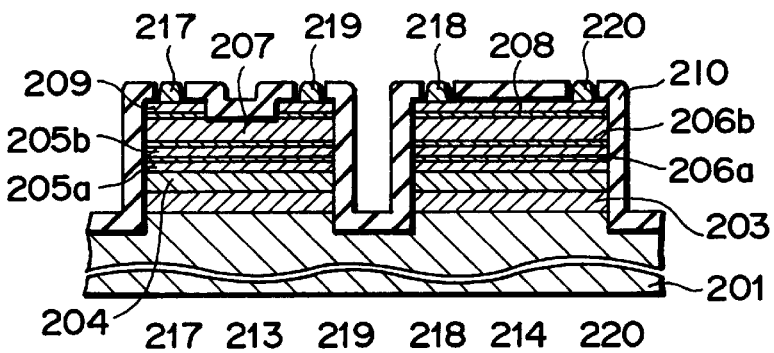
Figure 2C:
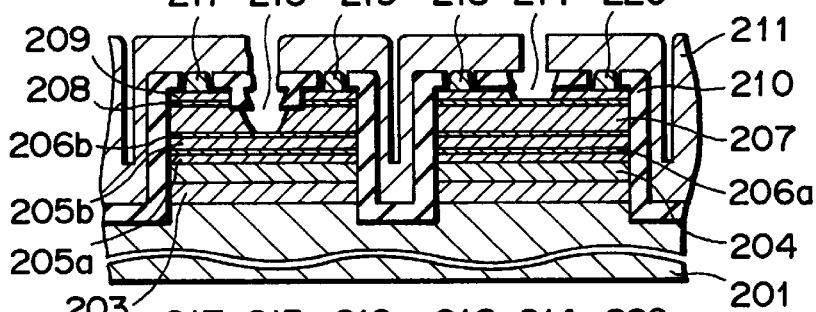
Figure 2D:
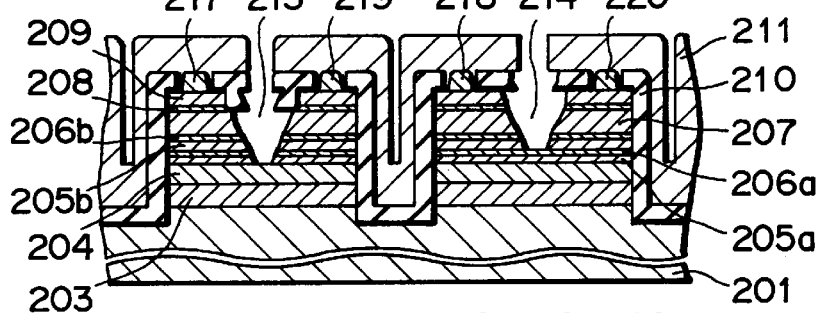
Figure 2E:
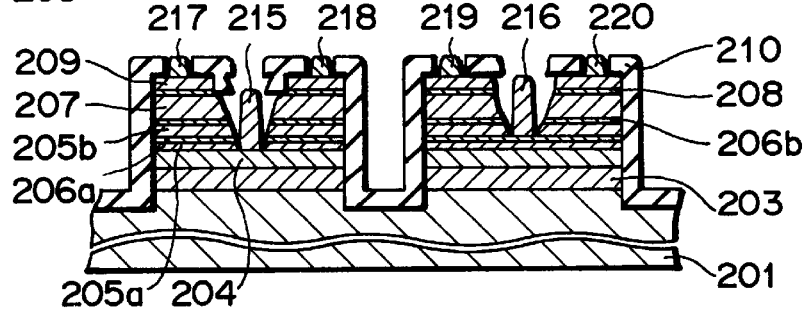
Figure 3:
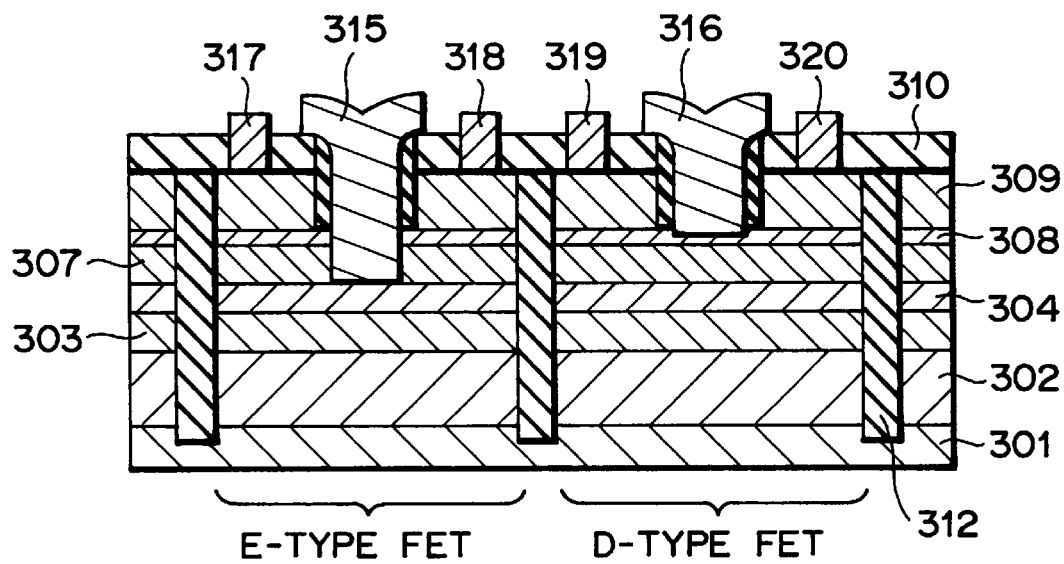
FIG. 3 is a section showing another prior art of the semiconductor device.
Figure 4A:
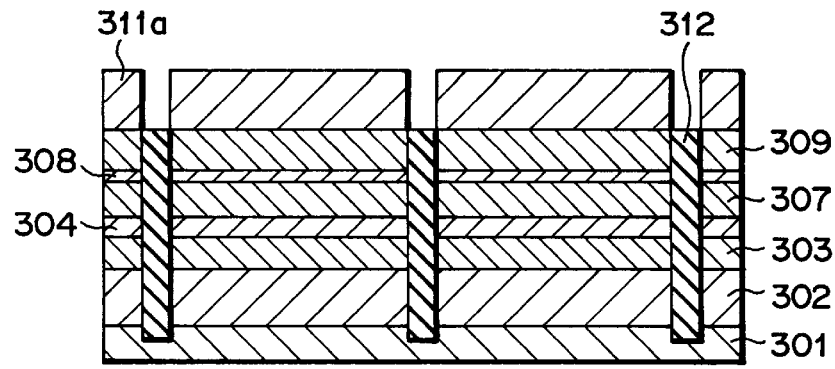
FIGS. 4A to 4F are sections showing a first fabrication process of the semiconductor shown in FIG. 3, illustrating process steps in sequential order.
Figure 4B:
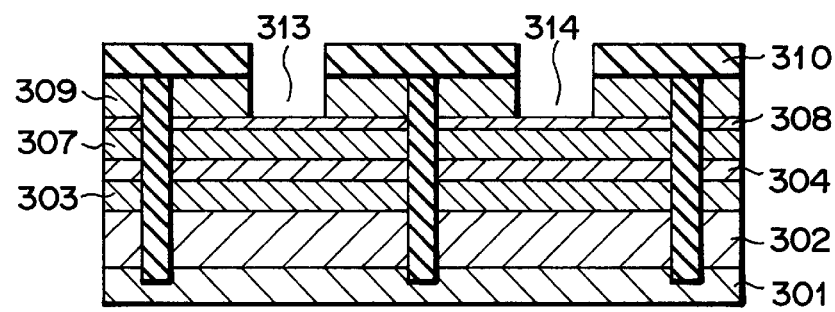
Figure 4C:
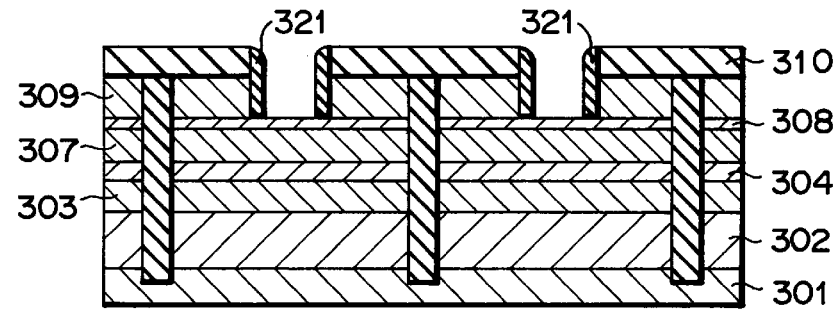
Figure 4D:
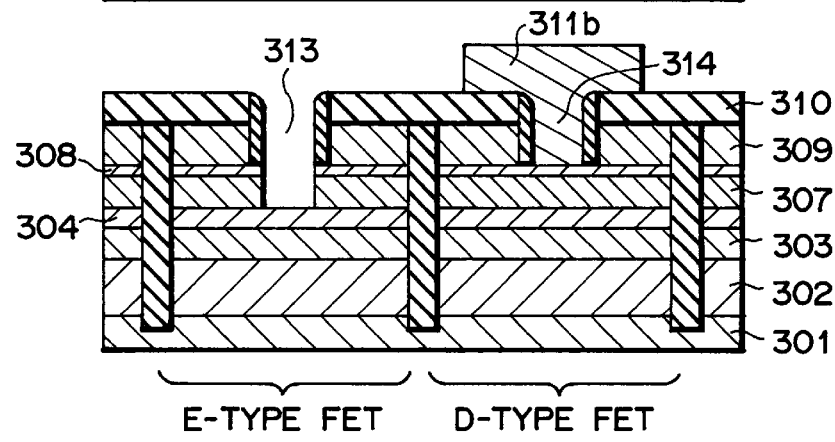
Figure 4E:
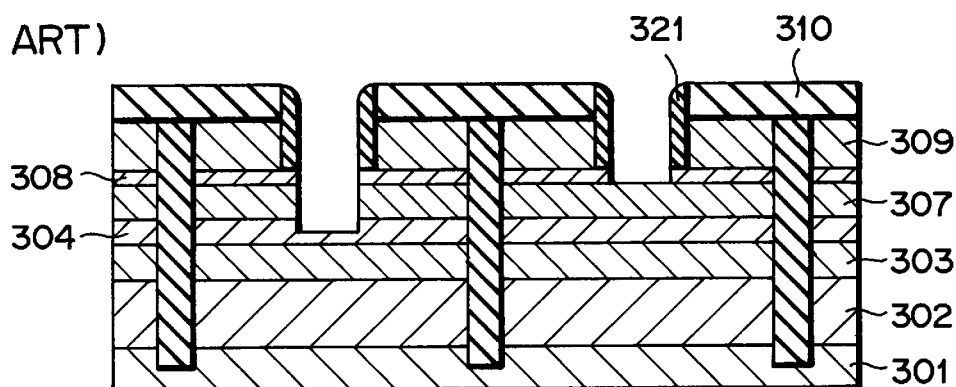
Figure 4F:
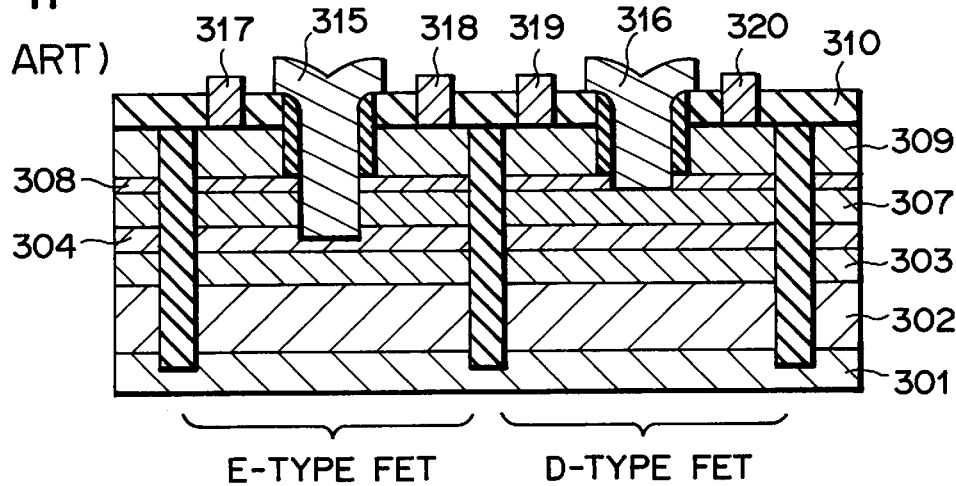
Figure 5A:
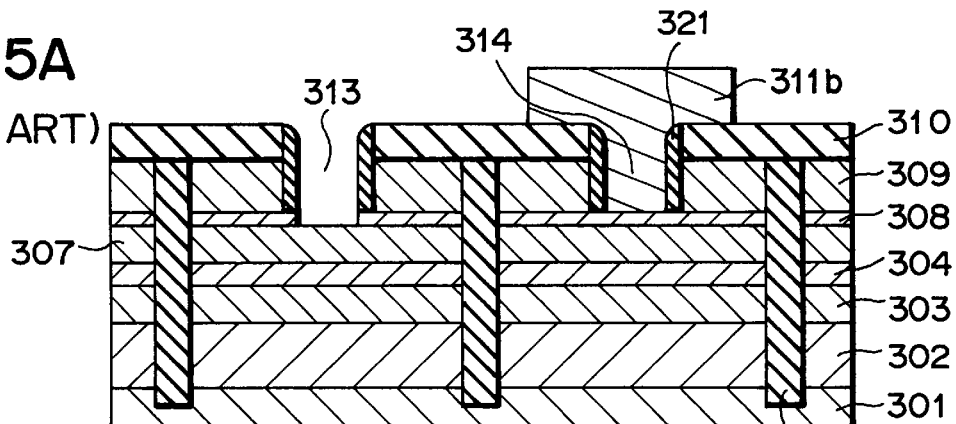
FIGS. 5A to 5C are sections showing a second fabrication process of the semiconductor device shown in FIG. 3, illustrating process steps in sequential order.
Figure 5B:
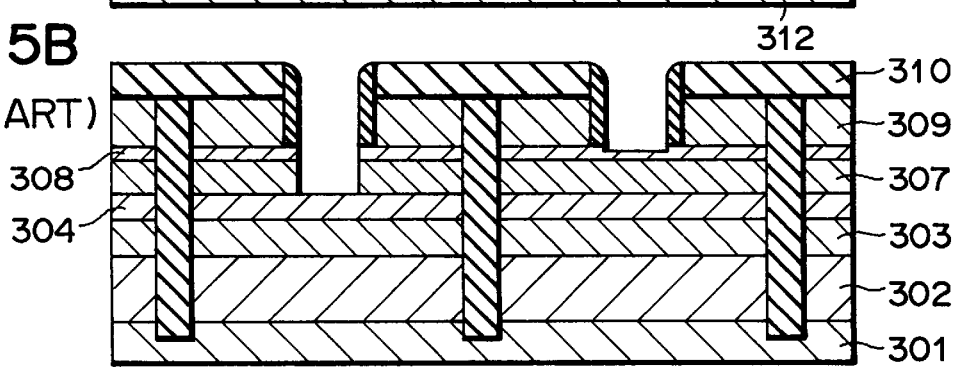
Figure 5C:
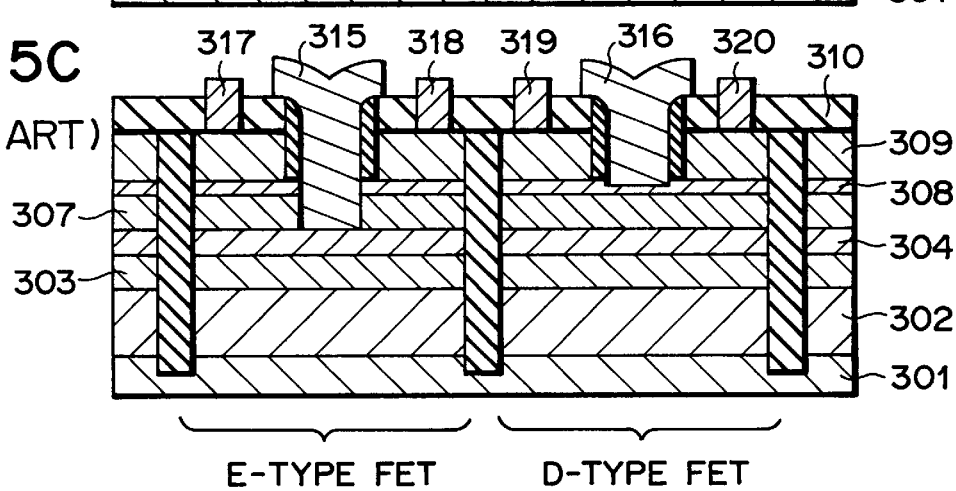
Figure 6:
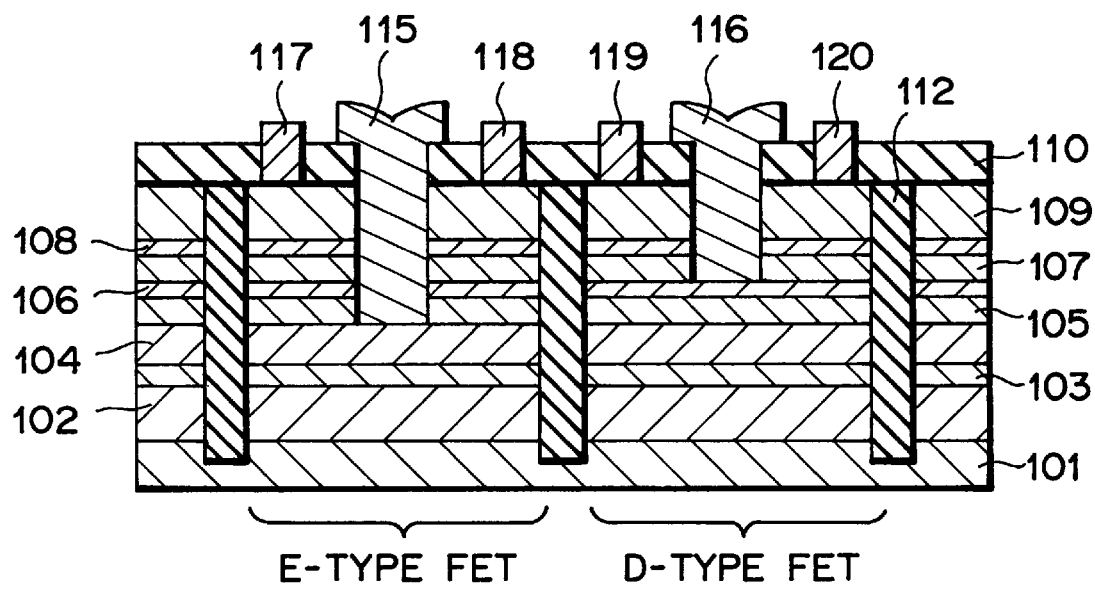
FIG. 6 is a section showing the first embodiment of a semiconductor device according to the present invention.

FIG. 6 is a section showing a compound semiconductor device according to the first embodiment of the present invention. The show semiconductor device has two different gate threshold voltages and is a compound semiconductor having E-type FET and D-type FET.

An undoped GaAs layer 102 with a thickness of 400 nm serving as a buffer layer, an undoped $In_{0.15}Ga_{0.85}As$ layer 103 with a thickness of 15 nm serving as a channel layer, an n-type $Al0.2Ga_{0.8}As$ layer 104 with a thickness of 15 nm serving as an electron supply layer, an n-type GaAs layer 105 with a thickness of 12 nm serving as a third GaAs layer (third semiconductor layer), an n-type $Al_{0.2}Ga_{0.8}As$ layer 106 with a thickness of 3 nm serving as a second etching stopper layer, an n-type GaAs layer 107 with a thickness of 12 nm serving as a second GaAs layer (second semiconductor layer), an n-type $Al_{0.2}Ga_{0.8}As$ layer 108 with a thickness of 3 nm serving as a first etching stopper layer, and an n-type GaAs layer 109 with a thickness of 80 nm serving as a contact layer, namely a first GaAs layer (first semiconductor layer), are grown on a semi-insulative GaAs substrate 101 in sequential order.

In the most preferred embodiment, the thickness of the first etching stopper layer 108 and the second etching stopper layer 106 are the same and the thickness of the second GaAs layer 107 and the third GaAs layer 105 are the same.

However, as set forth above, the layer thickness of the second GaAs layer 107 can be within a range of less than or equal to 120% and greater than or equal to 80% of the layer thickness, i.e. 12 nm, of the third GaAs layer 105. Therefore, the range of the layer thickness of the second GaAs layer 107 can be 14.4 to 9.6 nm.

Also, the layer thickness of the first etching stopper layer 108 can be within a range of less than or equal to 120% and greater than or equal to 80% of the layer thickness, i.e. 3 nm, of the second etching stopper layer 106. Therefore, the range of the layer thickness of the first etching stopper layer 108 can be 3.6 to 2.4 nm.

On the other hand, donor concentration in the n-type layer is $2 \times 10^{18}$ $cm^{-3}$. Also, an isolating region 112 extending from the n-type GaAs layer 109 to the inside of the substrate 101 through respective epitaxial layers 108 to 102, is formed. The isolating region 112 surrounds both the E-type FET region and the D-type FET region for isolation.

In the E-type FET, the Schottky gate electrode 115 is in contact with the electron supply layer 104. On the other hand, in the D-type FET, the Schottky gate electrode 116 is in contact with the second etching stopper layer 106. For forming the gate electrode, tungsten silicide (WSi) with a thickness of 100 nm and tungsten (W) with a thickness of 250 nm are used. However, any Schottky metal may be used. On the other hand, in the first GaAs layer 109 of the E-type and D-type FET regions, ohmic source electrodes 117 and 119 and ohmic drain electrode 118 and 120 formed of an alloy of gold, germanium and nickel (Au •Ge •Ni) which are provided in a form mutually connected with each other. On the GaAs contact layer 109, an insulation layer 110 formed of $SiO_2$ with a thickness of 300 nm is thereon.

Next, the fabrication process of the first embodiment of the semiconductor device will be discussed with reference to FIGS. 7A to 7H.

Figure 7A:
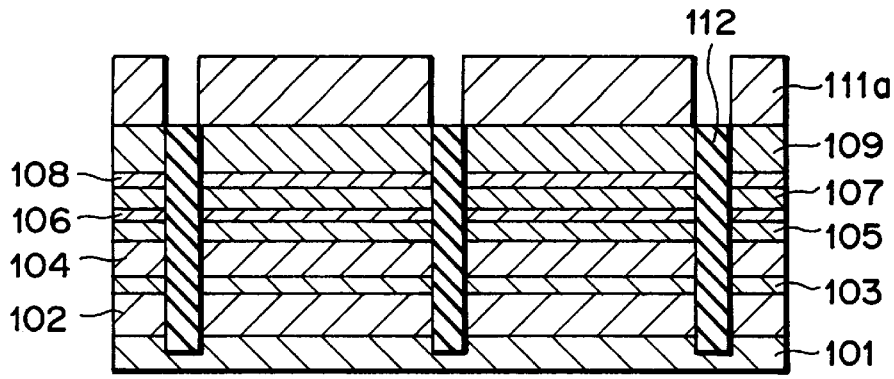
FIGS. 7A to 7H are sections showing the embodiment of a fabrication process of a semiconductor device of FIG. 6, according to the present invention.

At first, as shown in FIG. 7A, the buffer layer 102, the channel layer 103, the electron supply layer 104, the third GaAs layer 105, the second etching stopper layer 106, the second GaAs layer 107, the first etching stopper layer 108, and the first GaAs layer 109 are grown on a semi-insulative GaAs substrate in sequential order by MBE or MOCVD method. Composition, layer thickness and impurity concentration of respective layers are as illustrated in FIGS. 7A to 7H. Thereafter, ion implantation is performed by covering the element region with a photo resist layer having a thickness of 2 $\mu m$ to form the isolating region 112. At this time, ion implantation is performed using boron ion ($B^+$), at an acceleration energy of: 200 keV, and dose amount of: $5 \times 10^{13}$ $cm^{-3}$. Thereafter, the photo resist layer 111a is removed.

Figure 7B:
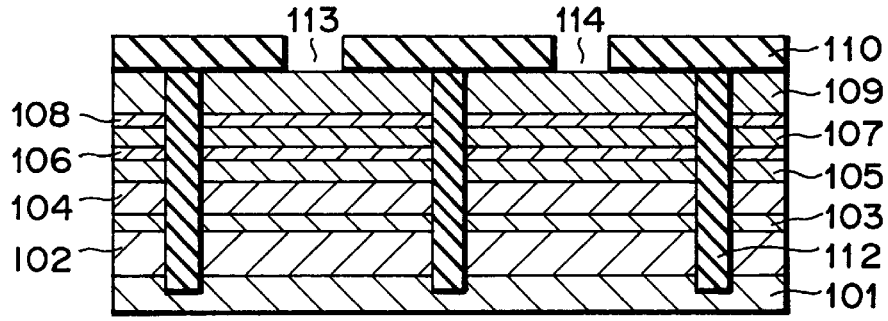

Next, as shown in FIG. 7B, an insulation layer 110 of $SiO_2$ with a thickness of 300 nm is grown on the first GaAs layer 109. Then, employing lithographic technology, a photo resist layer pattern is formed. Then, by RIE apparatus, dry etching is performed employing a mixture gas of carbon tetrafluoride ($CF_4$), fluorohydrocarbon ($CHF_3$) and argon (Ar) to form gate opening portions 113 and 114 in the E-type and D-type FET regions. Then, the photo resist layer is removed.

Figure 7C:
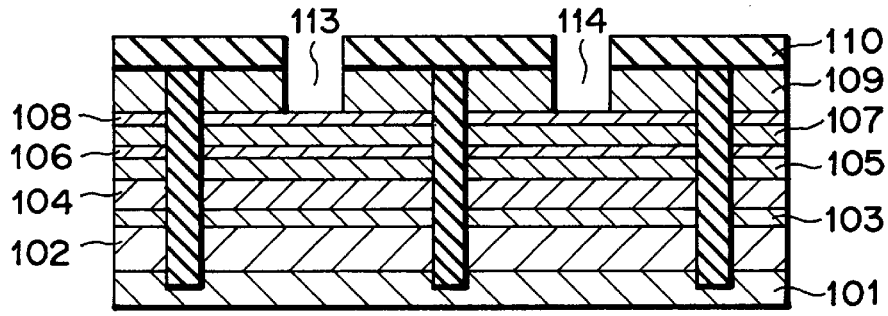

Then, as shown in FIG. 7C, by means of an electron cyclotron resonance (ECR) device, selective and anisotropic dry etching is performed for the first GaAs layer 109 with respect to the first etching stopper layer 108 under a condition of a gas mixture of silicon tetrachloride ($SiCl_4$) and carbon tetrafluoride ($CF_4$) flowing with a flow ratio of 1 of and a pressure: 0.5 Pa, using the insulation layer 110 having the gate openings 113 and 114.

As the condition for performing anisotropic and selective etching, any condition or other than that set forth above can be used as long as a selectivity ratio of greater than or equal to 100 of GaAs and AlGaAs can be realized and anisotropic etching can be preformed. For instance, it can be realized by using an ECR device or an RIE device employing a mixture gas containing chlorine and fluorine (boron trichloride ($BCl_3$)+sulfur hexafluoride ($SF_6$), chlorine ($Cl_2$)+$SF_6$, $SiCl_4$ +$SF_6$, $BCl_3$+nitrogen trifluoride ($NF_3$), $SiCl_4$ +silicon tetrafluoride ($SiF_4$)).

Figure 7D:
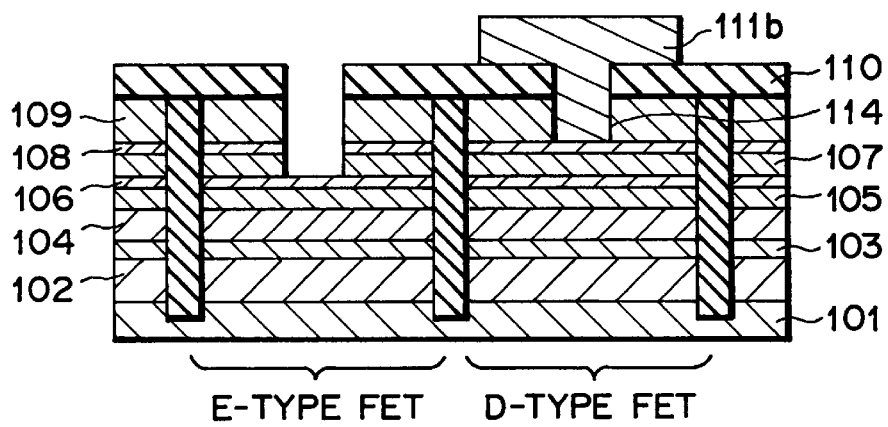

Next, as shown in FIG. 7D, by dipping in a hydrochloric acid solution (ratio of HCl and $H_2O$ is 1 : 1), aluminum fluoride ($AlF_3$) deposited on the surface of the etching stopper layer is removed. Thereafter, covering the gate opening 114 of the D-type FET, the first etching stopper layer 108 exposed in the E-type FET region is removed by a solution mixture of phosphoric acid and hydrogen peroxide to expose the surface of the second GaAs layer 107. Then, selective and anisotropic dry etching is performed for the second GaAs layer 107.

Figure 7E:
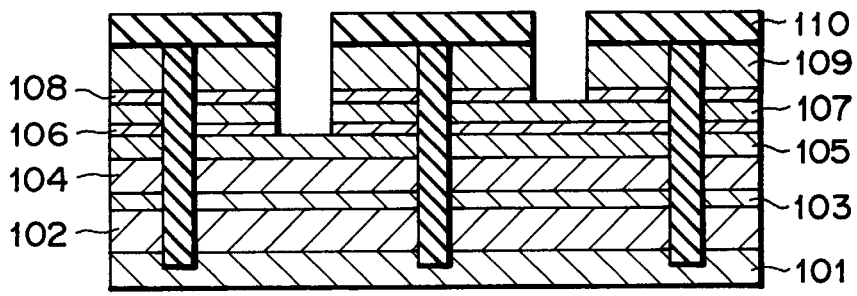

Next, as shown in FIG. 7E, after removing $AlF_3$, deposited on the surface of the etching stopper layer using a hydrochloric acid solution, the photo resist layer 111b is removed by oxygen plasma and high temperature organic peeling. By this process step, the n-type AlGaAs layer within the gate opening, namely the second etching stopper layer 106 in the case of the E-type FET region and the first etching stopper layer 10 in case of the D-type FET, is removed to expose clear surfaces of the GaAs layers 105 and 107. It should be noted that, if the layer thickness of the etching stopper layer is greater than or equal to 1 nm and less than or equal to 10 nm, etching can be performed without etching through the stopper layer by way of selective dry etching, and the etching stopper layer is removed by oxygen plasma and organic solvent containing chlorine.

Figure 7F:
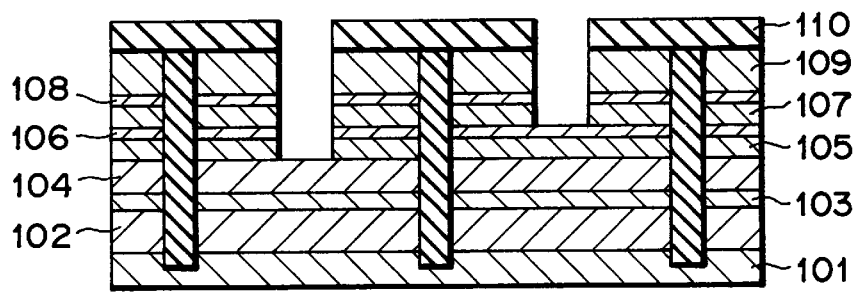

Next, as shown in FIG. 7F, selective anisotropic etching is performed for the third GaAs 105 with respect to the electron supply layer 104 in the E-type FET region and for the second GaAs layer 107 with respect to the second etching stopper layer 106 in the D-type FET region. Here, since the layer thickness of the third GaAs layer 105 and the second GaAs layer 107 are the same, a period of over etching can be shortened to reduce the etched out amount of the AlGaAs layer.

Figure 7G:
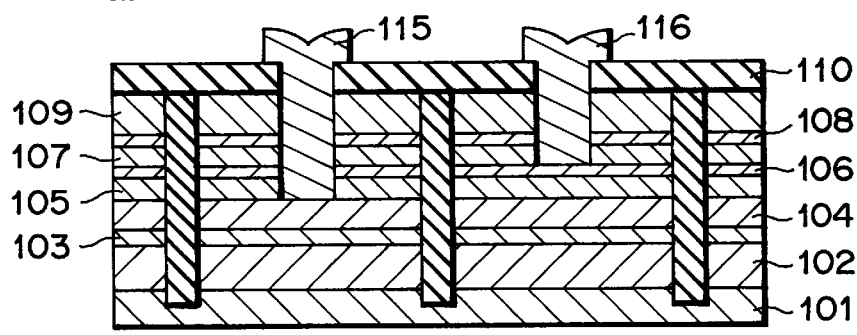

Subsequently, as shown in FIG. 7G, AlF3, deposited on the surface of the AlGaAs layers is removed by the hydrochloric acid solution to expose a clear surface of the AlGaAs layer. Then, WSi and W are deposited sequentially with thickness of 100 nm and 250 nm, respectively. Thereafter, by lithographic technology and dry etching technology, T-shaped Schottky gate regions 115 and 116 are formed.

Figure 7H:
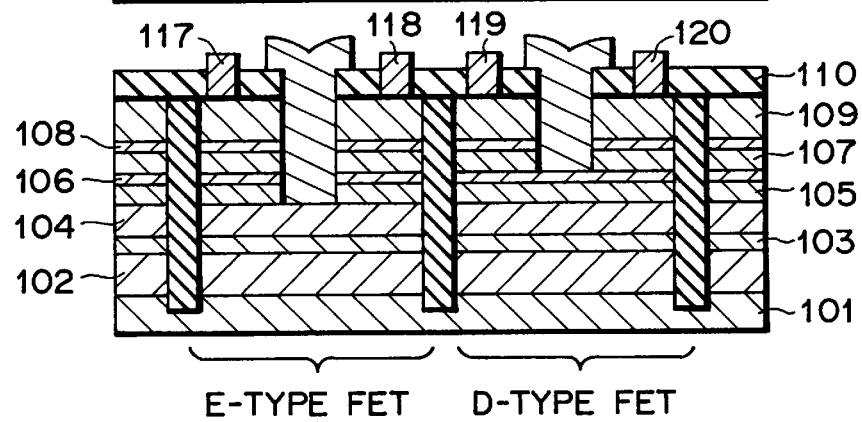

Next, as shown in FIG. 7H, in order to form ohmic electrodes, an opening is provided in the insulation layer 110 using a buffered fluoric acid using the photo resist layer as a mask, and then through processes of deposition, lift off and subsequent alloying, the source electrodes 117 and 119 and the drain electrodes 118 and 120, respectively, of AuGeNi are formed to obtain the semiconductor device shown in FIG. 6.

In the semiconductor device fabricated through the fabrication process set forth above, the following characteristics are shown in Table I average value of Vth, inplane standard deviation in wafer ($\sigma$Vth), standard deviation ($\sigma$Vth) between five wafers, reverse tolerance between gate and drain (BVgd) current and gain cut-off frequency (ft)) of E-type and D-type METs having a gate length of 0.4 $\mu$m.

TABLE 1

|  | Vth Average Value (V) | Inplane $\sigma$Vth (V) | $\sigma$Vth between 5 Wafers (V) | Bvgd Average (V) | Ft Average Value (GHz) |
| --- | --- | --- | --- | --- | --- |
| E-type | +0.32 | 0.037 | 0.043 | 13.5 | 46 |
| D-type | −0.60 | 0.032 | 0.046 | 8.0 | 37 |

As is clear from Table 1, high controllability of Vth is achieved by the present invention.

It should be noted that, in the foregoing embodiment, a GaAs layer is employed as the semiconductor layer, AlGaAs layers are employed as the etching stopper layer, and the electron supply layer and InGaAs layer are employed as the channel layer, any compound semiconductor layer, any composition ratio of compound, and any donor concentration may be employed in accordance with the teaching contained herein, or as will be apparent to those skilled in the art.

Next, the second embodiment of the semiconductor device according to the present invention will be discussed with reference to FIG. 8. FIGS. 9A to 9C are sections showing process steps of a fabrication process of the second embodiment of the semiconductor device.

In the second embodiment of the semiconductor device and the fabrication process shown in FIG. 8 and FIGS. 9A to 9C, like components to those of FIG. 6 and FIGS. 7A to 7H will be identified by like reference numerals, the detailed description of those components will be omitted for clarity.

Figure 8:
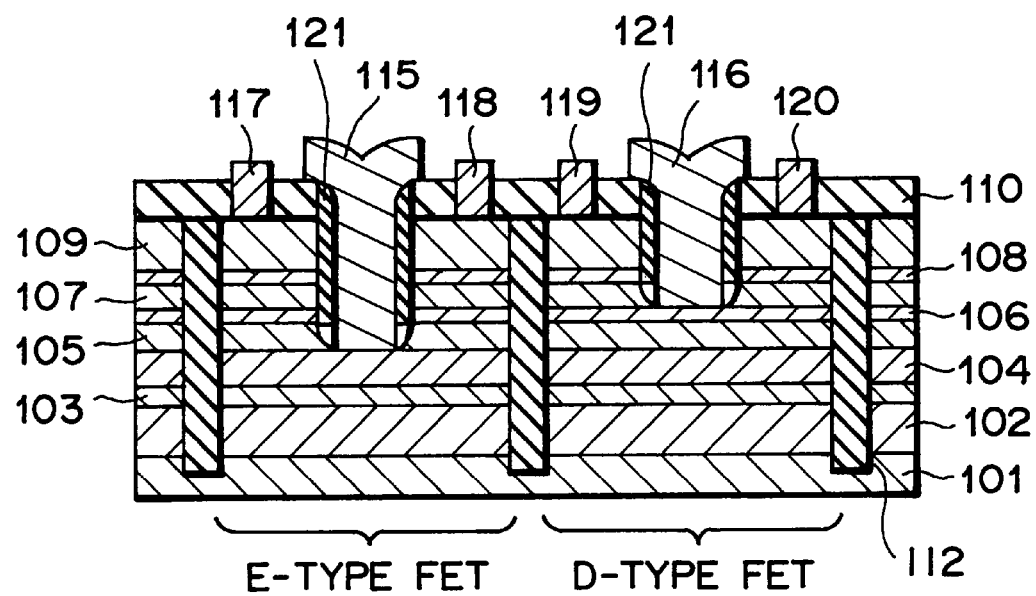
FIG. 8 is a section showing the second embodiment of a semiconductor device according to the present invention.
Figure 9A:
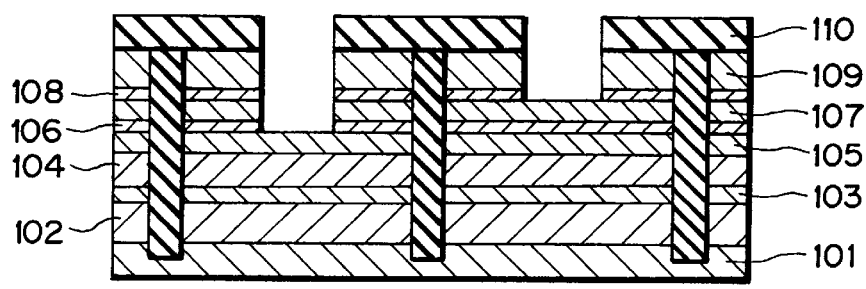
FIGS. 9A to 9D are sections showing the second embodiment of a fabrication process of a semiconductor device of FIG. 8, according to the present invention.
Figure 9B:
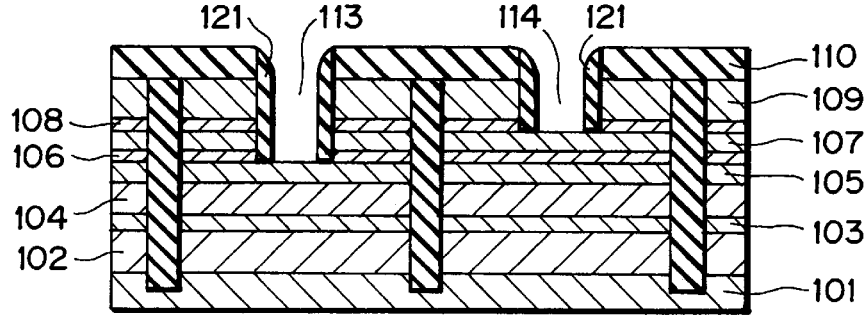
Figure 9C:
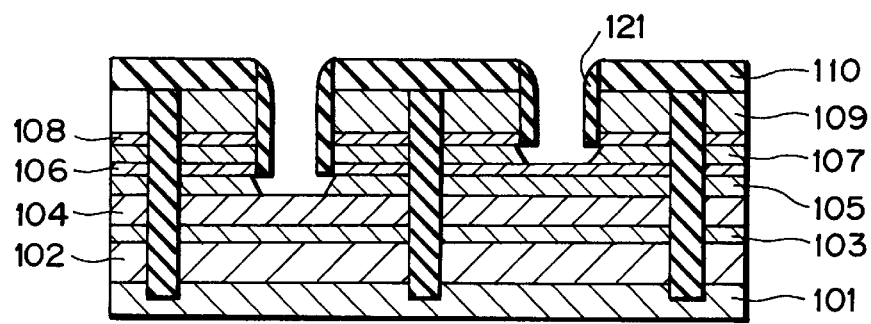

As shown in FIG. 8, the compound semiconductor device includes the buffer layer 102, the channel layer 103, the electron supply layer 104, the third semiconductor layer 105, the second etching stopper layer 106, the second semiconductor layer 107, the first etching stopper layer 108, and the first semiconductor layer 109, formed on a semi-insulative GaAs substrate 101. The first etching stopper layer thickness, and the second etching stopper layer have substantially the same layer thickness, and the second semiconductor layer 107 and the third semiconductor layer 105 have substantially the same layer thickness.

In the second embodiment, the Schottky gate electrode 115 is contacted with the electron supply layer 104 and not contacted with the third semiconductor layer 105, the second etching stopper layer 106, the second semiconductor layer 107, the first etching stopper layer 108 and the first semiconductor layer 109, in the E-type FET.

The Schottky gate electrode 116 is contacted with the second etching stopper layer 106 and not contacted with the second semiconductor layer 107, the first etching stopper layer 108 and the first semiconductor layer 109, in the D-type FET.

Next, discussion will be given to a preferred fabrication process of the second embodiment of the semiconductor device with reference to FIGS. 9A to 9D.

At first, as shown in FIG. 9A, similar to the first embodiment, after selective and anistropic dry etching of the second GaAs layer (second semiconductor layer) 107 is performed with respect to the second etching stopper layer 106 in the E-type FET region, the second etching stopper layer 106 in the E-type FET region and first etching stopper layer 108 in the D-type FET region are selectively removed by dipping in hydrochloric acid solution, oxygen plasma and high temperature organic peeling process including chlorine, to selectively expose the third GaAs layer (third semiconductor layer in the E-type FET region and the second GaAs layer 107 in the D-type FET region).

Next, as shown in FIG. 9B, after deposition of insulation layer 121 of $SiO_2$ with a thickness of 100 nm over the entire surface, anisotropic dry etching is performed over the entire surface surface by RIE employing $SF_6$ or $CF_4$ and $CHF_3$ gas to form the side wall insulation layer 121 on the side surfaces of the insulation layer 110, the first GaAs layer (first semiconductor layer) 109, the first etching stopper layer 108, the second GaAs layer (second semiconductor layer) 107 and the second etching stopper layer 106 of the gate opening portion 113 in the E-type FET region, and on the side surfaces of insulation layer 110, the first gas layer (first semiconductor layer) 109, and the first etching stopper layer 106 of the gate opening in the D-type FET region.

Next, as shown in FIG. 9C, selective and isotropic dry etching is performed for the third GaAs layer 105 with respect to the electron supply layer 104 in the E-type FET region and the second GaAs layer 107 with respect to the second etching stopper layer 106 in the D-type FET region, to cause side etching. Here, as a condition for selective isotropic dry etching, an ECR device is employed, a mixture gas of $BCl_3$ and $SF_6$ is used in a ratio of flow rate of 3 : 1, a pressure of 1 Pa and a microwave power of 100W.

Figure 9D:
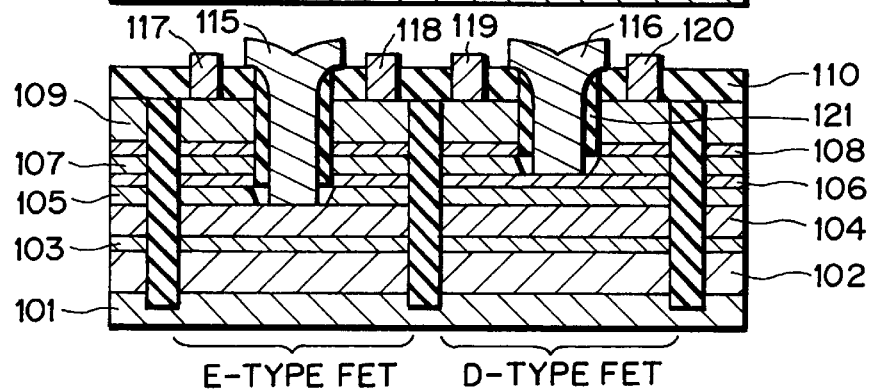

Then, as shown in FIG. 9D, the Schottky gate electrodes 115 and 116, ohmic source electrodes 117 and 119 and ohmic drain electrodes 118 and 120 are formed to obtain the shown embodiment of the semiconductor device.

By side etching of the side wall insulation layer 121 and third and second semiconductor layers 105 and 107, the gate electrode 115 of the E-type FET is not contacted with the third semiconductor layer 105, the second etching stopper layer 106, the second semiconductor layer 107, the first etching stopper layer 108 and the first semiconductor layer 109. Also, the gate electrode 116 of the D-type FET is not contacted with the second semiconductor layer 107, the first etching stopper layer 108 and the first semiconductor layer 109.

It should be noted that, in the fabrication process of the second embodiment of the semiconductor device, after etching the second semiconductor layer of the E-type FET region, the side wall insulation layer is formed. However, it is also possible to form the side wall insulation layer after etching of the first semiconductor layer, to perform isotropic etching of the second semiconductor layer 107 of the E-type FET region, and then to perform isotropic dry etching of the third semiconductor layer 105 in the E-type FET region and the second semiconductor layer 107 in the D-type FET region.

On the other hand, after etching of the first semiconductor layer, etching of the second semiconductor layer 107 of the E-type FET region, and then etching the third semiconductor layer 105 of the E-type FET region and the second semiconductor region 107 in the D-type FET region, and after forming the side wall insulation layer, the gate electrode may be formed.

In the second embodiment, since the insulation layer is inserted between the first GaAs layer and the gate electrode, a parasitic capacity Cp around the gate becomes smaller, to increase current gain cut-off frequency ft of the FET, for example. Furthermore, since the contact area between the gate electrode and the GaAs layer becomes small, leakage of the gate current becomes smaller thus making the breakdown voltage greater.

In the semiconductor device fabricated through the fabrication process set forth above, the following characteristics are shown in Table 2 average value of Vth, inplane standard deviation in wafer (σVth), standard deviation (σVth) between five wafers, reverse tolerance between gate and drain (BVgd), and current gain cut-off frequency (ft)) of E-type and D-type FETs having a gate length of 0.3 $\mu$m.

TABLE 2

|  | Vth Average Value (V) | Inplane σVth (V) | σVth between 5 Wafers (V) | Bvgd Average (V) | Ft Average Value (GHz) |
| --- | --- | --- | --- | --- | --- |
| E-type | +0.32 | 0.035 | 0.040 | 15.5 | 50 |
| D-type | −0.61 | 0.038 | 0.045 | 9.7 | 40 |

As is clear from Table 2, high controllability of Vth can be achieved.

The first effect of the present invention is that desired value of Vth of the E-type and D-type FETs can be obtained with good reproductively to improve controllability. By this, yield in fabrication can be improved. The reason is that, since the layer thickness of the second and third semiconductor layers can be substantially equal to each other, the second and third semiconductor layers can be etched with a minimum time simultaneously, and immediately after etching, the gate electrodes are formed.

The second effect of the present invention is to improve control of the gate length, an important factor for high frequency characteristics of the FET. The reason is that, similar to the above, the layer thickness of the second and third semiconductor layers becomes substantially equal to each other.

Although the present invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments within the spirit and scope encompassed and equivalents thereof with respect to the feature set out in the appended claims.

What is claimed is:

1. A semiconductor device having mutually different two gate threshold voltages, comprising:

a semiconductor substrate;

a channel layer formed on said semiconductor substrate;

an electron supply layer formed on said channel layer;

a third semiconductor layer formed on said electron supply layer;

a second etching stopper later formed on said third semiconductor layer;

a second semiconductor layer formed on said second etching stopper later, a layer thickness of said second semiconductor layer being substantially equal to a layer thickness of said third semiconductor layer;

a first etching stopper layer formed on said second semiconductor layer, said first etching stopper layer having a layer thickness substantially equal to that of said second etching stopper layer; and a first semiconductor layer formed on said first etching stopper.

2. A semiconductor device as set forth in claim 1, further comprising;

a first gate electrode contacting with an upper surface of said electron supply layer; and, a second gate electrode contacting with an upper surface of said second etching stopper layer or said third semiconductor layer.

3. A semiconductor device as set forth in claim 2, wherein said first gate electrode is so separated as to not contact with said third semiconductor layer, said second etching stopper layer, said second semiconductor layer, said first etching stopper layer and said first semiconductor layer; and said second gate electrode is so separated as not to contact with said second semiconductor layer, said first etching stopper layer and said first semiconductor layer.

4. A semiconductor device as set forth in claim 3, wherein the layer thickness of said second semiconductor layer is less than or equal to 120% and greater than or equal to 80% of the layer thickness of said third semiconductor layer; and the layer thickness of said first etching stopper layer is less than or equal to 120% and greater than or equal to 80% of the layer thickness of said second etching stopper layer.

* * * * *